United States Patent
Friedman et al.

(10) Patent No.: US 7,863,952 B2
(45) Date of Patent: Jan. 4, 2011

(54) METHOD AND CIRCUIT FOR CONTROLLING CLOCK FREQUENCY OF AN ELECTRONIC CIRCUIT WITH NOISE MITIGATION

(75) Inventors: Daniel Joseph Friedman, Sleepy Hollow, NY (US); Alexander V. Rylyakov, Mount Kisco, NY (US); Jose A. Tierno, Stamford, CT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 12/023,933

(22) Filed: Jan. 31, 2008

(65) Prior Publication Data

US 2009/0195278 A1 Aug. 6, 2009

(51) Int. Cl.
*H03L 7/06* (2006.01)
(52) U.S. Cl. .................. 327/150; 327/159; 327/166; 327/291
(58) Field of Classification Search .......... 327/165, 327/166, 291, 141, 144–163; 375/373–376; 331/15–17
See application file for complete search history.

(56) References Cited

U.S. PATENT DOCUMENTS

| | | | | |
|---|---|---|---|---|
| 5,727,038 | A * | 3/1998 | May et al. ............ | 375/376 |
| 5,940,785 | A | 8/1999 | Georgiou et al. | |
| 6,252,464 | B1 * | 6/2001 | Richards et al. ............ | 331/4 |
| 6,535,986 | B1 | 3/2003 | Rosno et al. | |
| 6,934,872 | B2 | 8/2005 | Wong et al. | |
| 7,132,895 | B2 | 11/2006 | Roth | |
| 7,385,539 | B2 | 6/2008 | Vanselow et al. | |
| 2002/0070811 | A1 | 6/2002 | Skierszkan | |
| 2005/0232385 | A1 * | 10/2005 | Yoshikawa et al. .......... | 375/376 |
| 2006/0215798 | A1 | 9/2006 | Nelson | |
| 2006/0284746 | A1 * | 12/2006 | Huang et al. ............ | 341/50 |
| 2007/0025490 | A1 | 2/2007 | Azadet et al. | |
| 2007/0222526 | A1 | 9/2007 | Mayer et al. | |

FOREIGN PATENT DOCUMENTS

WO 2007073632 A1 3/2006

OTHER PUBLICATIONS

Wikipedia—Phase-locked loop http://en.wikipedia.org/wiki/Phase-locked_loop.*
Uht, A.K, "Uniprocessor Performance Enhancement Through Adaptive Clock Frequency Control", IEEE Computer Society, vol. 54, No. 2, Feb. 2005. pp. 132-140.
Liotta, "Wide Range of Output Frequencies Differentiates Fully Integrated Clock",retrieved Mar. 3, 2008, pp. 1-3. http://electronicdesign.com/Article/Index.cfm?AD=1&ArticleID=9611.

(Continued)

*Primary Examiner*—Lincoln Donovan
*Assistant Examiner*—Brandon S Cole
(74) *Attorney, Agent, or Firm*—Yee & Associates, P.C.; Diana R. Gerhardt

(57) ABSTRACT

A technique to mitigate noise spikes in an electronic circuit device such as an integrated circuit. The clock frequency of a clock signal used by the electronic circuit is controlled such that instantaneously large changes to the clock frequency are avoided by use of a frequency filter that is capable of generating frequency ramps having a linear slope which is used as a feedback signal in a digital phase-locked loop clock circuit in lieu of a discrete, stair-stepped feedback control signal.

9 Claims, 2 Drawing Sheets

OTHER PUBLICATIONS

Mahashin, "Optimize Timing Margins For Your High-Speed Interface", retrieved on Mar. 5, 2008, pp. 1-9. http://electronicdesign.com/Article/Index.cfm?AD=1&ArticleID=9611.

USPTO Notice of Allowance for U.S. Appl. No. 12/024,457 dated Apr. 16, 2009.

* cited by examiner

METHOD AND CIRCUIT FOR CONTROLLING CLOCK FREQUENCY OF AN ELECTRONIC CIRCUIT WITH NOISE MITIGATION

This invention was made with the United States Government support under Agreement No. HR0011-07-9-0002 awarded by DARPA. THE GOVERNMENT HAS CERTAIN RIGHTS IN THE INVENTION.

BACKGROUND

1. Field of the Invention

The present application relates generally to a control mechanism within an electronic circuit device, and more particular the present application relates to a control mechanism for modifying the frequency of a digital circuit clock signal in such a way that mitigates noise signals such as power supply noise.

2. Description of the Related Art

It is often desirable to change the frequency of the clock driving a digital circuit in response to software load variations, power and temperature constraints, etc. Typically, this is done by stopping the activity in the processor, changing the clock frequency, and then restarting the activity in the processor. Processor activity is stopped prior to the frequency change because large, sudden changes in that frequency typically cause a very large instantaneous variation in the current consumed by the processor. This large instantaneous current variation in turn typically creates a large perturbation in the power supply of the processor, a perturbation that can be fatal to the operation of the digital circuit.

It would thus be desirable to provide a mechanism for changing the frequency of the clock provided to a large digital circuit (such as a processor) while limiting the maximum amount of current variation (di/dt) associated with the clock frequency change.

SUMMARY

The current invention provides a mechanism for changing the frequency of the clock provided to a large digital circuit (such as a processor) while limiting the maximum amount of current variation (di/dt) associated with the clock frequency change. This invention thus enables controlled frequency changes in large digital circuits while creating a limited amount of frequency change-induced noise on the digital circuit power supply. The current invention is thus directed to a technique to mitigate noise spikes in an electronic circuit when modifying the operating frequency of such circuit. The clock frequency of a clock signal used by the electronic circuit is controlled such that instantaneous changes to the clock frequency are avoided by use of a frequency filter that is capable of generating frequency ramps having a linear slope which is used as a feedback signal in a digital phase-locked loop clock circuit in lieu of a discrete, stair-stepped feedback control signal. The frequency filter receives a desired frequency as a digital word at an input of the filter. The desired frequency word and the current frequency word are compared to generate a boolean result indicating that the new desired word is greater than the current word, matches the current word, or is less than the current word. This result is weighted by the proportional and integral filter coefficients, Kp and Ki, respectively, and is then combined with the current frequency word to create a new frequency output word. This new frequency output word is applied to the synthesizer at the feedback portion of the DPLL as a new divide ratio request so that the feedback path is a smooth ramp instead of a series of non-continuous, discrete signals.

BRIEF DESCRIPTION OF THE DRAWINGS

The novel features believed characteristic of the illustrative embodiments are set forth in the appended claims. The illustrative embodiments themselves, however, as well as a preferred mode of use, further objectives and advantages thereof, will best be understood by reference to the following detailed description of the illustrative embodiments when read in conjunction with the accompanying drawings, wherein:

DETAILED DESCRIPTION OF THE PREFERRED EMBODIMENT

Figure 1:
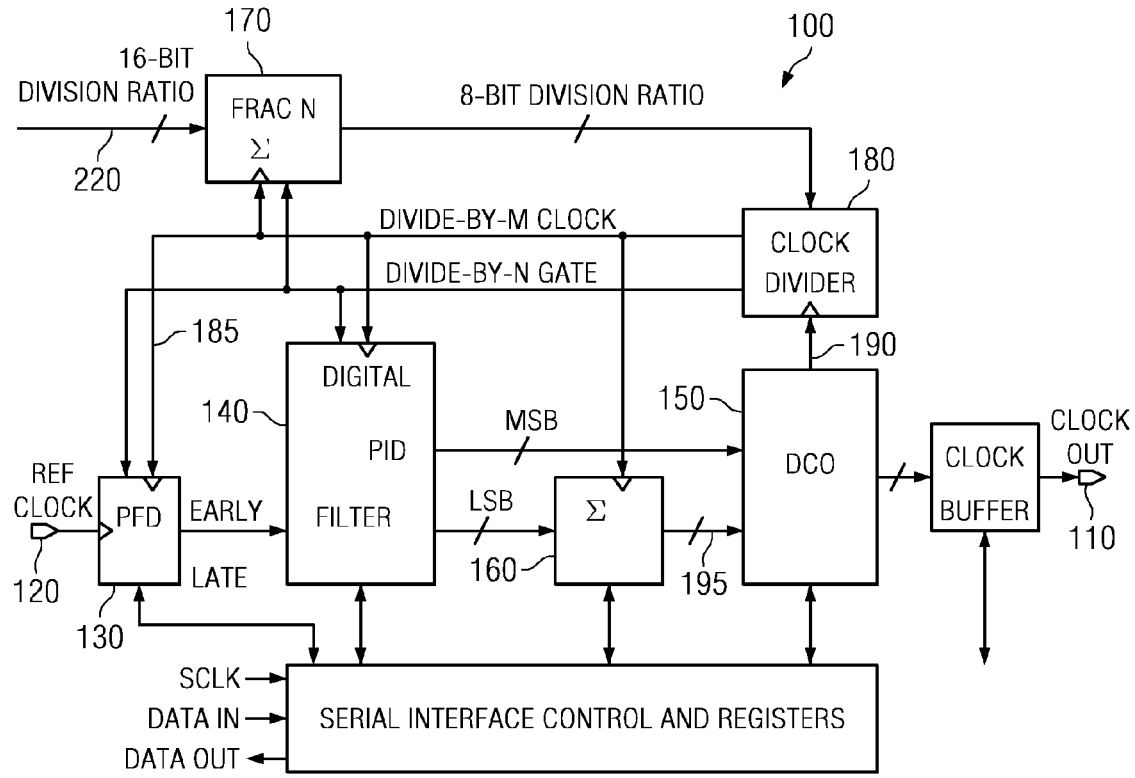
FIG. 1 depicts a digital phase-locked loop (digital PLL or DPLL) architecture with fractional-N frequency synthesis.

The current invention provides a mechanism for changing the frequency of the clock provided to a large digital circuit (such as a processor) while limiting the maximum amount of current variation (di/dt) associated with the clock frequency change. This invention thus enables controlled frequency changes in large digital circuits while creating a limited amount of frequency change-induced noise on the digital circuit power supply. The current invention is thus directed to a technique to mitigate noise spikes in an electronic circuit when modifying the operating frequency of such circuit. The primary components of the invention are as follows:

digital circuit to be driven: large, clocked digital circuit (such as a processor)

frequency synthesizer: a device that synthesizes a frequency given a control input (digital phase locked loop, or DPLL)

frequency filter: a device that generates a control input for the frequency synthesizer with desirable characteristics FIG. 1 shows a block diagram of a digital PLL 100 (DPLL). This circuit synthesizes an output frequency 110 that is an integer or fractional multiple of its input reference clock frequency 120. This output frequency 110 is the clock signal for an electronic circuit (not shown). The main elements of the DPLL circuit 100 are a phase and frequency detector (PFD) 130, a loop filter 140, a digitally controlled oscillator (DCO) 150, a forward sigma-delta modulator 160, a fractional-N sigma-delta modulator 170, and a feedback divider 180. The circuit operates by using the PFD 130 to compare arriving reference clock edges to feedback clock edges, where the reference clock edges are provided by a stable external source at 120 and the feedback clock edges are derived from the output DCO frequency 190, typically after that frequency has been passed through the divider 180 to form feedback clock 185. The phase relationship (leading or lagging) between the reference clock 120 and the feedback clock 185 is processed in the loop filter 140, producing a control word that is applied to the DCO 150. Because it is impractical to realize a DCO with sufficient bits of precision to enable the full control word to be applied directly to the DCO 150, the least significant control bits (LSB) are applied as a dithered, fractional sub-word 195 to the DCO 150, where the forward sigma-delta modulator 160 is used to create the appropriate dithering sequence to represent that sub-word. If a non-integer multiple of the reference clock frequency is desired as the output, the feedback divider can be modulated using the fractional-N delta sigma modulator block 170, creating an effective non-integer feedback divide ratio.

The operating frequency of the DPLL can be changed in several ways: the reference clock frequency could be changed; the feedback divide ratio could be changed; or a new digital word could be applied to the DCO itself. In each of these scenarios, the PLL would typically unlock and then re-establish lock. The more significant the frequency change that is initiated, the greater the induced power supply noise will be. Furthermore, the dynamics of re-acquiring lock will generally not be well-controlled.

The fundamental behavior that is leveraged in the frequency filter (described below) is the ability to create a digitally controlled frequency trajectory. The active current in the system (i) is proportional to the system capacitance (c), voltage (v), and operating frequency (f):

$$i \propto cvf$$

Therefore, $$di/dt \propto cv\, df/dt$$

Because di/dt is proportional to df/dt, managing df/dt enables the management of di/dt.

Figure 2:
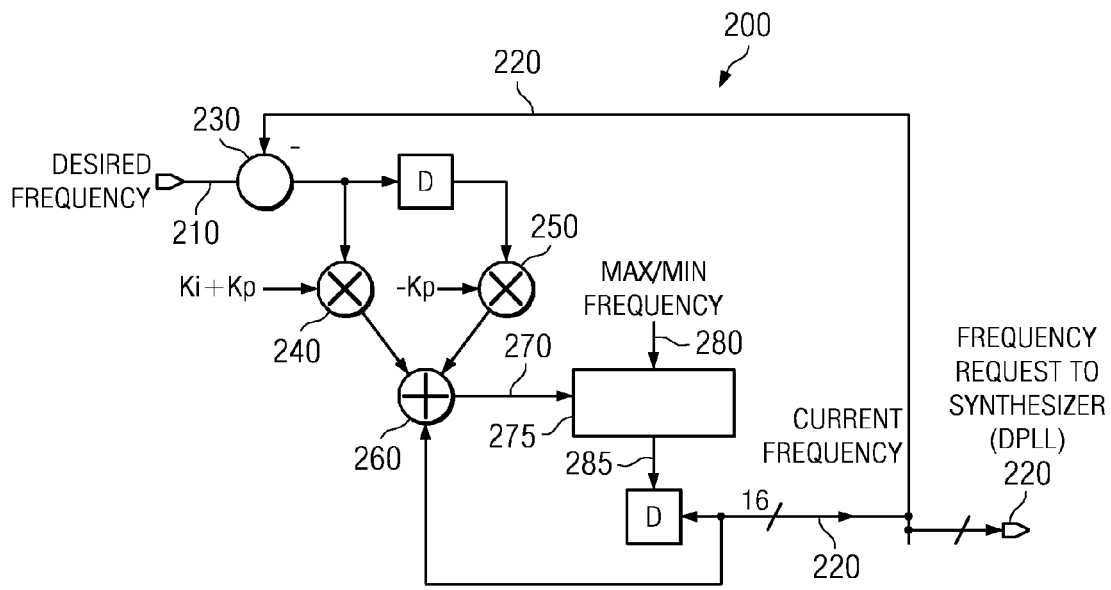
FIG. 2 depicts a filter capable of generating frequency ramps.

FIG. 2 shows the frequency filter 200, the device that generates a control input for the frequency synthesizer 100 of FIG. 1 such that the rate of change of output frequency 110 can be limited, thereby enabling far more predictable and stable power supply behavior for the digital circuit driven by the synthesizer. In operation, the desired frequency is applied as a digital word to the input 210 of the frequency filter 200. The desired frequency word 210 and the current frequency word 220 are compared at 230 and a 2-bit result is generated, indicating that the new word is greater than the current word, matches the current word, or is less than the current word. This result is weighted by the proportional and integral filter coefficients, Kp and Ki, respectively, at 240 and 250 and is then combined at 260 with the current frequency word 220 to create a new output frequency word. This output word is applied to the synthesizer as a new divide ratio request that is presented as the 16-bit division ratio value that is input to fractional-N delta sigma modulation block 170 previously described with respect to FIG. 1. An intervening saturation logic block 275 is provided to enforce minimum and maximum frequency control words that can be applied to the divider controls. As long as the control word 270 is between the externally supplied minimum and maximum frequency limits 280, the saturation logic control word at the output 285 of the saturation logic block 275 is the same as the control word 270. Once either of those limits has been reached, however, the output frequency control word 220 is held at the relevant limit such that hardware constraints on the system clock are maintained.

Once this new frequency request 220 is applied to the DPLL 100 of FIG. 1, the DPLL will lock to the new frequency subject to the time constant of the DPLL itself. With sufficiently small steps in changes made to the frequency control word (controllable by setting the Kp and Ki coefficients of the frequency filter 200) and sufficiently slow update rates, the action of the frequency filter will dominate the dynamics of synthesizer behavior, thus enabling the management of di/dt (and hence induced power supply) associated with frequency change requests.

In this filter, Ki represents the integration constant of the filter and it indicates how quickly the filter can ramp from one frequency to another. Kp is the proportional constant of the filter, and for normal operation it can be set to 0, but it also can be used as a damping factor for the response of the frequency filter.

Thus, the frequency filter 200 creates a frequency request ramp that is used as the feedback path signal for the DPLL (which advantageously eliminates use of discrete, stair-stepped frequency requests in such feedback path) to thus provide a relatively constant di/dt when the frequency is being changed in response to a requested frequency change. This relatively constant di/dt directly results in reduced/mitigated noise spikes that would otherwise be generated using a discreet, stepped feedback signal.

Figure 3:
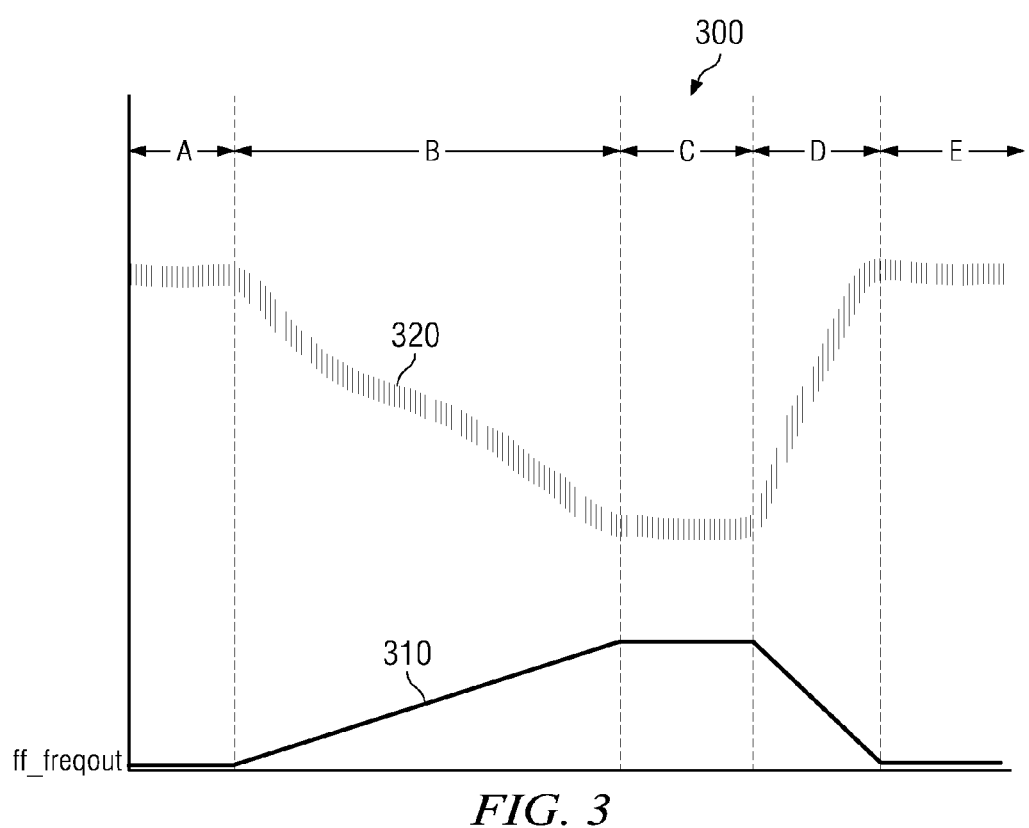
FIG. 3 depicts use of a feedback ramp control signal used to vary the clock frequency generated by a digital PLL in a non-discreet, substantially linear fashion such that di/dt induced noise is mitigated during frequency adjustment/variation.

FIG. 3 shows the response of a system including a DPLL and a frequency filter to frequency ramp requests. An initial frequency speed-up request is issued at the end of area A; this results in the output frequency (ff_freqout) request word 310 changing from constant to steadily slewing upward (area B). Simultaneously, the period of the output clock as depicted at 320 steadily shrinks in a well-controlled manner. Once the new frequency is achieved, the PLL operates with no further changes, and the ff_freqout indicator word 310 is stable (area C). At the end of this plateau in the ff_freqout word 310, a request to reduce the clock frequency is received and the DPLL again smoothly increases its clock period to achieve the new target (area D), then is stable once more (area E). Because the frequency slew is smooth, the induced di/dt (and hence power supply dv/dt) due to the frequency change will be small, making the minimum cycle time produced by the synthesizer predictable; this enables the synthesizer to be used to clock the attached digital circuit safely throughout the frequency change event. The ramp is effectively implemented by generating a succession of closely spaced digital words that are used as frequency multipliers. The illusion of a smooth frequency ramp is achieved when the relevant bandwidth of the frequency synthesizer is such that the frequency stepping falls out of the system bandwidth. In other words, the output frequency is not allowed to move under the dynamics of the DPLL, but instead will follow the closely spaced digital input words, and interpolate the frequencies between those words. If the spacing is too large, interpolation will not be smooth and result in a staircase effect on the output frequency, with the corresponding increase in undesirable di/dt.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the illustrative embodiments have been presented for purposes of illustration and description, and is not intended to be exhaustive or limited to the illustrative embodiments in the form disclosed. Many modifications and variations will be apparent to those of ordinary skill in the art. The embodiment was chosen and described in order to best explain the principles of the illustrative embodiments, the practical application, and to enable others of ordinary skill in the art to understand the illustrative embodiments for various embodiments with various modifications as are suited to the particular use contemplated.

What is claimed is:

1. A method in an electronic circuit device for controlling frequency of a clock signal used by the electronic circuit device, comprising steps of:

comparing a current frequency of the clock signal with a desired frequency of the clock signal to determine if the desired frequency is one of greater than, less than, and equal to the current frequency signal to form a ramp control signal; and using the ramp control signal to modify the current frequency of the clock signal, wherein the ramp control signal has substantially linear characteristics, wherein the ramp control signal is a plurality of closely spaced in time digital words and wherein the plurality of closely spaced in time digital words are used as frequency multipliers by a phase-locked loop circuit that generates the clock signal.

2. The method of claim 1, wherein the ramp control signal is formed by:

comparing a current frequency of the clock signal with a desired frequency of the clock signal to determine if the desired frequency is one of greater than, less than, and equal to the current frequency to form an intermediary control signal;

proportionally weighting the intermediary control signal by a first integer filter coefficient to form a first weighted control signal;

proportionally weighting the intermediary control signal by a second integer filter coefficient to form a second weighted control signal; and combining the first weighted control signal, the second weighted control signal, and a control word that indicates the current frequency of the clock signal together to form the ramp control signal.

3. An electronic circuit, comprising:

a digital phase-locked loop (DPLL) having a reference clock input coupled to a digital phase detector circuit, a clock output, and a digital control word feedback path also coupled to the digital phase detector circuit; and a frequency filter circuit having a desired frequency input and a requested frequency output that is operatively coupled to the digital control word feedback path of the DPLL, wherein the requested frequency output provides a continuous series of requested frequencies in a ramped, linear fashion by a plurality of closely spaced in time digital words and wherein the plurality of closely spaced in time digital words are used as frequency multipliers by a phase-locked loop circuit that generates the clock signal.

4. The electronic circuit of claim 3, wherein the digital phase-locked loop provides a clock signal at the clock output for clocking the electronic circuit.

5. The electronic circuit of claim 3, further comprising a saturation circuit coupled to an output of the frequency filter circuit, wherein the saturation circuit ensures that the requested frequency output generated by the frequency filter circuit are maintained within minimum and maximum control words that are associated with, respectively, allowable minimum and maximum operational clock frequencies for the electronic circuit.

6. A method in an electronic circuit device for controlling frequency of a clock signal used by the electronic circuit device by generating a plurality of closely spaced in time digital words that are based upon a comparison of a current operating frequency of the clock signal and a desired operating frequency of the clock signal, and using the plurality of closely spaced in time digital words to modify the current operating frequency of the clock signal.

7. The method of claim 6, wherein the electronic circuit comprises a digital phase-locked loop (DPLL) having a reference clock input coupled to a digital phase detector circuit, a clock output, and a digital control word feedback path also coupled to the digital phase detector circuit, and wherein the plurality of closely spaced in time digital words are used as frequency multipliers by the digital phase-locked loop.

8. A method in an electronic circuit device for controlling frequency of a clock signal used by the electronic circuit device by generating a plurality of closely spaced in time digital words that are based upon a comparison of a current operating frequency of the clock signal and a desired operating frequency of the clock signal, and using the plurality of closely spaced in time digital words to modify the current operating frequency of the clock signal, wherein the generating step comprises:

comparing the current operating frequency of the clock signal with the desired operating frequency of the clock signal to determine if the desired operating frequency is one of greater than, less than, and equal to the current operating frequency to form an intermediary control signal;

proportionally weighting the intermediary control signal by a first integer filter coefficient to form a first weighted control signal;

proportionally weighting the intermediary control signal by a second integer filter coefficient to form a second weighted control signal; and combining the first weighted control signal, the second weighted control signal, and a control word that indicates the current operating frequency of the clock signal together to form the plurality of closely spaced in time digital words.

9. The method of claim 8, wherein the electronic circuit comprises a digital phase-locked loop (DPLL) having a reference clock input coupled to a digital phase detector circuit, a clock output, and a digital control word feedback path also coupled to the digital phase detector circuit, and wherein the plurality of closely spaced in time digital words are used as frequency multipliers by the digital phase-locked loop.

* * * * *